United States Patent
Rasmussen

(10) Patent No.: US 11,365,119 B2
(45) Date of Patent: Jun. 21, 2022

(54) DEVICE HAVING A MEMBRANE AND METHOD OF MANUFACTURE

(71) Applicant: TDK Corporation, Tokyo (JP)

(72) Inventor: Kurt Rasmussen, Herlev (DK)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/149,141

(22) Filed: Jan. 14, 2021

(65) Prior Publication Data

US 2021/0300753 A1 Sep. 30, 2021

(30) Foreign Application Priority Data

Mar. 26, 2020 (DE) .......................... 102020108433.1

(51) Int. Cl.
*H04R 7/00* (2006.01)
*B81C 1/00* (2006.01)
(Continued)

(52) U.S. Cl.
CPC ........ *B81C 1/00595* (2013.01); *B81B 3/0021* (2013.01); *H04R 7/06* (2013.01); *H04R 7/16* (2013.01); *H04R 19/04* (2013.01); *H04R 31/003* (2013.01); *B81B 2201/0257* (2013.01); *B81B 2203/0127* (2013.01); *B81B 2203/0315* (2013.01); *B81C 2201/014* (2013.01); *B81C 2201/0109* (2013.01);
(Continued)

(58) Field of Classification Search
CPC ........ B81C 1/00595; B81C 2201/0109; B81C 2201/0132; B81C 2201/0133; B81C 2201/014; B81C 1/00182; B81B 3/0021; B81B 2201/0257; B81B 2203/0127; B81B 2203/0315; H04R 7/06; H04R 7/16; H04R 19/04; H04R 31/003; H04R 2201/003

See application file for complete search history.

(56) References Cited

U.S. PATENT DOCUMENTS 9,458,009 B2 10/2016 Dehe et al.
10,462,579 B2 10/2019 Barzen
(Continued)

FOREIGN PATENT DOCUMENTS

DE 102014103341 A1 9/2014
DE 102016114451 A1 2/2017

*Primary Examiner* — Matthew A Eason
(74) *Attorney, Agent, or Firm* — Slater Matsil, LLP

(57) ABSTRACT

In an embodiment a device includes a substrate including an upper substrate surface and a lower substrate surface and a membrane-layer suspended above the upper substrate surface, wherein the substrate includes a recess penetrating the substrate between the lower substrate surface and the upper substrate surface, wherein the membrane-layer spans the recess, wherein the recess includes an upper recess region, an intermediate recess region, and a lower recess region, wherein the upper recess region is a part of the recess in direct vicinity to the upper substrate surface, the intermediate recess region is a part of the recess directly below the upper recess region, and the lower recess region is a part of the recess other than the upper recess region and the intermediate recess region, and wherein a cross-sectional area of the upper recess region determined parallel to the upper substrate surface is larger than a respective cross-sectional area of the intermediate recess region.

20 Claims, 10 Drawing Sheets

(51) Int. Cl.
*B81B 3/00* (2006.01)
*H04R 7/06* (2006.01)
*H04R 7/16* (2006.01)
*H04R 31/00* (2006.01)
*H04R 19/04* (2006.01)

(52) U.S. Cl.
CPC ............... *B81C 2201/0132* (2013.01); *B81C 2201/0133* (2013.01); *H04R 2201/003* (2013.01)

(56) References Cited

U.S. PATENT DOCUMENTS

| | | |
|---|---|---|
| 2004/0140732 A1 | 7/2004 | Truninger et al. |
| 2010/0044808 A1 | 2/2010 | Dekker et al. |
| 2010/0327702 A1 | 12/2010 | Martin et al. |
| 2018/0376270 A1* | 12/2018 | Wang .................... H04R 31/00 |

* cited by examiner

DEVICE HAVING A MEMBRANE AND METHOD OF MANUFACTURE

CROSS-REFERENCE TO RELATED APPLICATIONS

This application claims priority to German Patent Application No. 102020108433.1, filed on Mar. 26, 2020, which application is hereby incorporated herein by reference.

TECHNICAL FIELD

In many devices, such as devices relying on MEMS (Micro Electro Mechanical System) technology, and in particular in MEMS microphones a recess is realized in a substrate. Such a recess may be part of a sound channel in MEMS microphones.

BACKGROUND

For a fast, cost efficient, and large scale fabrication of such devices the method of forming such a recess must include a fast etching step.

Typically, in a first step, components of such a device are assembled on a substrate, and subsequently a recess is etched into the substrate from the back side, i.e. the side opposite to the side on which the components are assembled.

This etching often is a deep reactive ion etching (DRIE) technique, with which high etching rates of at least 20 mm/min into silicon substrate can be achieved.

The drawback of this fast backside etching may be a non-well-defined wall of the recess or the sound channel in a MEMS microphone, in particular in vicinity of a membrane.

However, in particular, the performance of the micro mechanical components such as membranes strongly depends on the well-defined nature of such a recess or a sound channel. In particular, the diameter of the active membrane area depends on the precision of the etching technique.

In other words, the smoothness of the recess in vicinity of the micromechanical components is crucial.

Deviations in the order of tens of micrometers from an intended membrane shape can already cause considerable deterioration of the membrane sensitivity, of the robustness and consequently of the device performance.

Previously, this problem was addressed unsatisfactorily, by slow and expensive modification of the back-side DRIE etching, for example. In particular, reduction of the etching rate and highly elaborate application of a bias voltage to masks were applied.

SUMMARY

Embodiments provide a device with a well-defined recess in the vicinity of the membrane. Further embodiments provide a method for accurately defining the dimensions and smoothness of the recess in vicinity of the membrane.

Embodiments provide a device wherein
a substrate comprises an upper substrate surface and a lower substrate surface, and the lower substrate surface is a surface of the substrate opposite to the upper substrate surface,
a membrane-layer is suspended above the upper substrate surface,
the substrate comprises a recess, which penetrates the substrate between the lower substrate surface and the upper substrate surface,
the membrane spans the recess,
the recess comprises an upper recess region, an intermediate recess region and a lower recess region, and the upper recess region is a part of the recess in direct vicinity to the upper substrate surface, the intermediate recess region is a part of the recess directly below the upper recess region, and the lower recess region is a part of the recess other than the upper recess region and the intermediate recess region,
the cross-sectional area of the upper recess region determined parallel to the upper substrate surface is larger than the respective cross-sectional area of the intermediate recess region.

This means that the upper recess region, i.e. the region of the recess in direct vicinity to the membrane-layer, is wider than the intermediate recess region, which lies directly below the upper recess region.

Thereby, a step is formed at the boundary between upper recess region and intermediate recess region.

In principle, this step is not necessarily uniform throughout the entire boundary between upper recess region and intermediate recess region.

Typically, the generally intended shape of the recess is identical for all regions of the recess. For example, the intended shape may be a cylindrical shape, i.e. in all recess regions, the cross sectional area parallel to the upper substrate surface may be of circular, oval, or elliptical shape, with walls oriented perpendicularly with respect to the upper substrate surface.

Preferentially, the deviations from an intended shape are smaller for the upper recess region than for the intermediate recess region. More preferentially, the deviations from an intended shape are smaller for the upper recess region than for the intermediate and the lower recess region.

For example a deviation from an intended shape or roughness in the upper recess region may be ±1 μm or less. However, a deviation from an intended shape or roughness in the intermediate recess region or in the intermediate and the lower recess region may be up to ±15 μm.

Thus, the opening in the upper substrate surface can be defined with a small tolerance of ±1 μm. Thus the membrane active area can be well-defined.

At the same time, the higher tolerance towards deviations of the intermediate recess region or of the intermediate and the lower recess region allows for the application of fast and cost efficient structuring methods with lower accuracy requirements.

According to one embodiment, the device can be realized such that
a first insulation layer is arranged between the upper substrate surface and the membrane-layer,
the first insulation layer comprises an opening framed by a lower etch stopper and the lower etch stopper is positioned at a distance e outward from an edge of the upper recess region, and
the lower etch stopper has a higher tensile strength than a main component of the first insulation layer.

Typically, membranes in micromechanical devices in general, and in MEMS microphones in particular are electrically conductive.

Arranging the first insulation layer between the upper substrate surface and the membrane, can electrically insulate the membrane and the substrate. This is particularly relevant in a case, where also the substrate is electrically conductive.

According to the above addressed embodiment, the lower etch stopper frames the opening in the first insulation layer. Typically, the lower etch stopper is electrically insulating too.

In addition to the advantages of the lower etch stopper in a manufacturing process mentioned below, the lower etch stopper can also bring advantages for the performance of the component.

Typically, the membrane-layer may be arranged directly on the first insulation layer. Thus, a part of the membrane-layer is free-standing directly above the opening in the first insulation layer framed by the lower etch stopper.

In such a case, the lower etch stopper forms the lower membrane suspension. When a force is applied to the membrane, for example upon sound pressure, this lower membrane suspension faces high stress.

By realizing the lower etch stopper to consist of a material with higher tensile strength than the main component of the insulation layer, the resistivity towards brakeage can be enhanced.

Therefore, the overall durability of the device against stress can be enhanced as compared to a case, in which the lower membrane suspension consists of the main component of the insulation layer, which typically is a tensile weak material, such as silicon oxide.

For example, the lower etch stopper may comprise low-stress silicon nitride as a main component, and the rest of the first insulation layer may consist of silicon oxide.

By having a smooth, well-defined opening in the upper substrate surface, also the distance e between the lower etch stopper and the edge formed by the recess in the upper substrate surface can be well-defined. This means deviations in e can also be kept in the range of ±1 µm or less.

According to a further embodiment, the device can be realized such that a second insulation layer is arranged directly above the membrane, an opening in the second insulation layer is framed by an upper etch stopper the upper etch stopper has a higher tensile strength than a main component of the second insulation layer.

The second insulation layer may electrically insulate the membrane-layer from other functional parts of the device, such as for example a back plate of a MEMS microphone. Further, the second insulation layer may form a spacer arranged between membrane and back plate.

The advantages of the upper etch stopper are equivalent to those of the lower etch stopper, in particular concerning providing a high tensile strength to the upper membrane suspension.

According to a further embodiment, the device can be realized such that a silicon nitride layer is arranged directly on the upper substrate surface, and an opening in the silicon nitride layer is at least as wide as the opening of the recess in the upper substrate surface and at maximum as wide as the opening in the first insulation layer.

In particular in a case, in which also a lower etch stopper consisting of silicon nitride is realized, the silicon nitride layer can be advantageous. The silicon nitride layer can serve as a firm basis for the lower etch stopper. This can reduce the risk of mechanical braking of the lower etch stopper from the underlying material.

According to a further embodiment, the device can be realized such that the substrate material is silicon, a material of the upper and the lower insulation layer comprises silicon oxide, and a material of the lower etch stopper and of the upper etch stopper comprises at least one substance selected from silicon and silicon nitride.

According to a further embodiment the device can be a MEMS microphone

Embodiments provide a method for forming a device wherein a substrate is provided, which comprises an upper and a lower substrate surface that are opposing each other, a continuous, self-contained trench with a width w and a depth d is formed in the upper substrate surface by a first structuring method, the trench is filled with a filling material, a membrane-layer is formed above the upper substrate surface comprising the filled trench, a preliminary recess is formed in the substrate by a second etching technique applied from the side of the lower substrate surface, the preliminary recess comprises a preliminary upper recess region extending from the upper substrate surface to the depth d, and the preliminary upper recess region is framed by the filling material of the trench, an intermediate recess region is the region of the preliminary recess directly below the preliminary upper recess region, the sidewalls of the intermediate recess region lie within a spatial volume perpendicularly below the trench, a lower recess region is a part of the preliminary recess other than the preliminary upper recess region and the intermediate recess region, a recess is formed by removing the filling material by a third etching technique, and the recess comprises the intermediate recess region, the lower recess region, and an upper recess region, and the upper recess region is formed by the combined volume of the trench and the preliminary upper recess region.

In other words, in the as defined process, first a trench is formed in the upper substrate surface. This trench is continuous and self-contained. This means that an inner fraction of the upper substrate surface is enclosed by the trench and an outer fraction of the substrate surface is a fraction of the substrate surface, which is not enclosed by the trench.

An outer rim of this trench will define the rim of the upper recess region, i.e. the opening of the recess in the upper substrate surface of the final product.

Preferably, the side walls of the trench are oriented approximately perpendicularly with respect to the upper substrate surface.

After forming of the trench, it is filled with a filling material. Typically, the filling material can be a material other than the material of the substrate.

Typically, the filling material and the upper substrate surface can form a mainly continuous surface together. This has the advantage that typical deposition methods for forming layered structures of MEMS devices can be applied.

Above the upper substrate surface, the membrane-layer is arranged.

In a next step, the second etching technique is applied from the back side, i.e. the side of the lower substrate surface.

Etching from the back side can be preferable, because it allows application of fast etching techniques, without the need of elaborate protection of the functional components of a MEMS device.

The preliminary recess is formed by the second etching technique. The preliminary recess comprises the preliminary upper recess region. The preliminary upper recess region is framed throughout its entire height by the filled trench, i.e. it has the height d complying with the depth of the trench.

To form the preliminary upper recess region the second etching technique removes all the material of the substrate enclosed by the trench.

The entire preliminary recess is formed by the second etching technique. This brings the advantage that within one etching step the entire preliminary recess can be formed without further differentiation of the process to form the different regions of the preliminary recess.

The intermediate recess region is arranged directly below the preliminary upper recess region. The sidewalls of the intermediate recess region are formed such, that they lie within a spatial volume perpendicularly below the trench. The term sidewalls of the intermediate recess region can be understood as surface of the substrate towards the intermediate recess region. Upon vertical parallel projection of all points forming the sidewalls of the intermediate recess region and of the trench into the plane of the upper substrate surface, all projected points of the sidewalls fall into the projected area of the trench.

This means that bulges of the sidewalls of the intermediate recess region must not extend into the recess beyond the inner rim of the trench, and notches in the sidewalls of the intermediate recess region must not extend into the substrate beyond the outer rim of the trench.

Preferentially, the sidewalls of both the intermediate recess region and the lower recess region lie within a spatial volume perpendicularly below the trench.

After forming the intermediate recess, the filling material of the trench is removed by a third etching technique.

Thus, the recess is formed by the combined volume of the preliminary upper recess region, the volume of the trench, the intermediate recess region and the lower recess region.

The upper recess region is defined as the combined volume of the preliminary upper recess region and the volume of the trench.

Thus, the position of the side walls in the upper recess region can be defined with the tolerance of the first structuring method that forms the trench and can be independent of the tolerance of the second etching technique.

Further also the structure of the sidewalls can be defined by the first structuring method.

Preferentially, the first structuring method can be chosen such that the structure of the sidewalls of the upper recess region is defined more exactly than the structure of the sidewalls formed by the second etching technique.

For example, the sidewalls of the upper recess region can have a smoother structure than those of the intermediate recess region and/or the lower recess region.

This allows forming the side walls of the recess in the vicinity of the substrate more accurately as by conventional methods, which are addressed in the introduction.

According to a further embodiment, the method is applied such that the width w of the trench is at least twice the tolerance of the second etching technique in forming the intermediate recess region.

If the width w of the trench is chosen such that it is twice the tolerance of the second etching technique, it can be realized easily that the sidewalls of the intermediate recess region lie within a spatial volume perpendicularly below the trench.

The width w, which is twice the tolerance width of the second etching technique, can compensate for deviations of the side walls of the intermediate recess region from an intended shape or position in both directions.

Thus the trench with the width w can compensate for the tolerance of the second etching technique.

According to a further embodiment, the method is applied such that the filling material is chosen to have a lower etching rate than the substrate in the second etching technique.

If the filling material of the trench is chosen such that it is etched slower than the substrate during application of the second etching technique, the filling is not fully dissolved during the second etching technique.

This can ensure that the sidewalls of the upper recess region are unaffected by the second etching technique, because the filling material protects all the substrate material within the depth d, which is not enclosed by the trench, from being etched.

According to a further embodiment, the method is applied such that the filling material is chosen to have a higher etching rate than the substrate in the third etching technique. Hence, the material-loss of the substrate during the third etching step is smaller than the removing rate of the filling material.

Thus, the filling material can be completely removed, without strong effects on the intended shape of the recess.

Preferentially, the filling material is chosen such that it has an at least 2 times higher etching rate than the substrate in the third etching technique.

Even more preferentially, the filling material is chosen such that it has an at least 5 times higher etching rate than the substrate in the third etching technique.

Ideally, the filling material is chosen such that it has an at least 10 times higher etching rate than the substrate in the third etching technique.

According to a further embodiment, the method is applied such that the first structuring method applied to the upper substrate surface has a lower tolerance than the second etching technique applied to the substrate.

This can bring the advantage that the deviations of the sidewalls of the upper recess region from an intended shape are lower than in a case where the entire recess is formed by the second etching technique only.

Tolerance, typically, describes the maximum deviation from an intended shape measured in a plane parallel to the plane of the upper substrate surface and in normal direction to the sidewall of the upper recess region.

According to a further embodiment, the method is applied such that the tolerance of the first structuring method applied to the upper substrate surface is at least 10 times smaller than the tolerance of the second etching technique applied to the substrate.

This brings the advantage that the shape of the upper recess region can be defined at least 10 times more accurately as if only the second etching technique was applied to form a recess.

According to a further embodiment, the method is applied such that the tolerance of the first structuring method applied to the upper substrate surface is ±1 □m or less and the tolerance of the second etching technique applied to the substrate is ±15 □m or less.

In particular, if combined with the embodiment, in which the width w of the trench is chosen to be twice the tolerance of the second etching technique, this allows applying a fast, but less precise second etching technique, while maintaining a well-defined recess in vicinity to the membrane-layer.

According to a further embodiment, the method is applied such that the substrate material is silicon, the filling material is at least one selected from the group comprising, silicon oxide, phosphosilicate glass, and borophosphosilicate glass, the first structuring method is a slow deep reactive ion etching technique applied from the side of the upper substrate surface, the second etching technique is a fast deep reactive ion etching technique applied from the side of the lower substrate surface, and the third etching technique is a buffered oxide etching technique.

Deep reactive ion etching (DRIE) methods are routinely applied to form structures on silicon substrates such as silicon wafers.

DRIE can be applied with high precision down to a surface roughness in the order of 10 nm, however on the cost of slow etching rates.

A slow DRIE method with high precision and slow etching rate can be applied to form the trench.

Preferentially, the slow DRIE method comprises application of a lithographically formed mask, as lithographic methods yield small tolerances in the order of ±1 µm or less.

For example the slow DRIE method has etching rates in the order of below 1 µm/min and up to 4 µm/min.

To form the preliminary cavity a fast DRIE method with lower precision but higher etching rate can be applied.

For example the fast DRIE method has etching rates in the order of above 10 µm/min, for example 10 to 30+µm/min.

The precise definition of the recess in vicinity to the membrane by a slow but precise etching step can be applied preferentially, because the upper recess region is much smaller than the sum of the intermediate and the lower recess region. For example, the height-fraction of the upper recess region of the recess as a whole can be 2% or below. Preferentially, the height-fraction of the upper recess region is between 0.25% and 2%.

Furthermore, the volume which has to be etched to form the trench is typically much smaller than the volume of the entire upper recess region. For example the volume contribution of the trench to the upper recess region may be below 15%. Typically the volume contribution of the trench to the upper recess region can be between 3% and 12%.

Further, silicon oxide is a preferential filling material, as it has a lower etching rate than silicon in DRIE, but can be etched efficiently by buffered oxide etching techniques.

Doped silicon oxide materials, such as phosphosilicate glass, and borophosphosilicate glass, are even more preferred filling materials, as they can be etched even faster by buffered oxide etching techniques.

In particular, if a MEMS layered structure contains further components comprising silicon oxide, which are intended to be etched simultaneously with the filling material, the use of doped silicon oxide as filling material is advantageous. The filling material of the trench is comparatively bulky in comparison to typical MEMS layered structures. Thus, the use of doped silicon oxide as filling material can reduce the etching time necessary to completely remove the filling material. Consequently the impact on other components and over-etching can be reduced.

According to a further embodiment, a chemical mechanical polishing step is applied to the upper substrate surface and the filled trench, directly after filling the trench with the filling material.

This polishing step can level out unevenness in the common surface formed by the upper substrate surface and the filled trench. This facilitates applying layered structures of a MEMS device, such as the membrane-layer. This can prevent imprinting of unevenness into layers deposited by typical techniques used in forming a MEMS layered structure.

According to a further embodiment, the method is applied such that a first insulation layer is formed between the upper substrate surface and the membrane-layer, a lower etch stopper is formed in the first insulation layer and the lower etch stopper is positioned at a distance e away from the outward rim of the trench, and the material of the lower etch stopper has a lower etching rate in the third etching technique than at least an inner portion of the first insulation layer, which is framed by the lower etch stopper.

As discussed above for the device, the lower etch stopper can be advantageous for the performance of the device.

Furthermore, the lower etch stopper can be formed such that an inner portion of the first insulation layer is framed by it.

Thereby, the third etching technique which etches the filling material can only impact or etch the inner portion of the first insulation layer, but not the rest of the first insulation layer, because the etch stopper can prevent the third etching technique accessing the rest of the first insulation layer.

As it is possible to define the shape and position of the recess in the upper substrate surface with high accuracy the etch stopper can be positioned close to the outward rim of the trench, because under-etching of the substrate below the etch stopper can be avoided.

As the lower etch stopper can be the lower membrane suspension, this can ensure a firm physical connection of the membrane-layer to the substrate through the lower etch stopper.

Furthermore, as the position of the etch stopper has not to cope with large tolerances in the position of the recess, the distance e can be that small, that contact of the membrane with an edge of the substrate at the opening of the recess in the upper substrate surface under high deflection of the membrane during operation can be avoided.

Contact of the membrane with the substrate edge can cause signal artifacts in a MEMS device. Repeated contact of the membrane with the substrate edge can lead to defects forming in the membrane, which can lead to membrane breakage.

According to a further embodiment, the method comprises the following further steps:

a second insulation layer is formed above the membrane-layer an upper etch stopper is formed in the second insulation layer, and the material of the upper etch stopper has a lower etching rate in the third etching technique than at least an inner portion of the second insulation layer, which is framed by the upper etch stopper.

Similar as for the lower etch stopper, the upper etch stopper can prevent etching of a fraction of the second insulation layer that is not the fraction framed by the upper etch stopper during the third etching technique.

According to a further embodiment, the method is applied such that the inner portion of the first insulation layer framed by the lower etch stopper and the inner portion of the second insulation layer framed by the upper etch stopper are removed during the third etching technique.

Typically, the third etching technique is applied either from the side of the lower substrate surface, i.e. through the recess or from the opposite direction, i.e. the front side. For example, small openings or pores in the membrane-layer or other structures arranged above the preliminary recess can allow for the application of third etching technique from the front side.

For example, an etching solution of a buffered oxide etching technique can be applied via such pores.

By removing the filling material together with the inner portions of the first and the second insulation layer in one etching step, the overall effort of the process can be reduced in comparison to separate etching steps.

Typically, a conventional approach already comprises an etching step to form openings in insulation layers. By forming of the openings and removing the filling material within one etching step, the excess effort caused by the present approach can be small compared to a conventional approach.

According to a further embodiment, the method comprises the following further steps:

a silicon nitride layer is formed directly on the upper substrate surface, before formation of the first insulation layer, and the silicon nitride layer is removed in a section arranged perpendicularly above the upper recess region by the third etching technique.

As discussed for the device, the silicon nitride layer can provide advantages for the as assembled device.

Furthermore, as the silicon nitride layer has a lower etching rate in both the second and the third etching technique, it can protect the comparatively thin insulation layers during these etching steps.

According to a further embodiment, the method is applied such that a the material of the upper and of the lower insulation layer comprises silicon oxide, and the material of the lower and of the upper etch stopper comprises at least one substance selected from silicon and silicon nitride.

Silicon oxide is a highly insulating material with preferential etching properties in particular during the second and the third etching technique. Therefore it can be applied advantageously as a material for the insulation layers.

Preferentially, membranes comprise a conductive material such as silicon or more preferentially doped silicon.

A membrane comprising silicon nitride can have advantageous tensile strength in comparison to a membrane which does not comprise silicon nitride.

For example, the membrane may have a layered structure, in which a silicon membrane central layer is sandwiched between a lower and an upper silicon nitride layer.

According to a further embodiment, the device fabricated by the method is a MEMS microphone.

BRIEF DESCRIPTION OF THE DRAWINGS

In the following the invention is explained in greater detail on the basis of exemplary embodiments and the associated figures.

The figures serve solely for elucidating the invention and are therefore illustrated only schematically and not in a manner true to scale. Individual parts may be illustrated in an enlarged manner or in a distorted manner in terms of the dimensions. Therefore, neither absolute nor relative dimensional specifications can be inferred from the figures. Identical or identically acting parts are provided with identical reference signs.

In the figures:

FIGS. 1 and 2 show a first step of a first embodiment of a method for forming a MEMS microphone in schematic top view and schematic cross section, respectively;

FIGS. 3 and 4 show a second step of a first embodiment of a method for forming a MEMS microphone in schematic top view and schematic cross section, respectively;

FIGS. 5 and 6 show a third step of a first embodiment of a method for forming a MEMS microphone in schematic top view and schematic cross section, respectively;

FIG. 7 shows a fourth step of a first embodiment of a method for forming a MEMS microphone in schematic cross section;

FIGS. 8 and 9 show a fifth step of a first embodiment of a method for forming a MEMS microphone in schematic top view and schematic cross section, respectively;

FIG. 10 shows a sixth step of a first embodiment of a method for forming a MEMS microphone in schematic cross section;

FIGS. 11 and 12 show a seventh step of a first embodiment of a method for forming a MEMS microphone in schematic top view and schematic cross section, respectively;

FIG. 13 shows an eighth step of a first embodiment of a method for forming a MEMS microphone in schematic cross section;

FIG. 14 shows a ninth step of a first embodiment of a method for forming a MEMS microphone in schematic cross section;

FIG. 15 shows a detailed excerpt of the ninth step of a first embodiment of a method for forming a MEMS microphone in schematic cross section;

FIG. 16 shows first embodiment of a MEMS microphone in schematic cross section;

Figure 17:
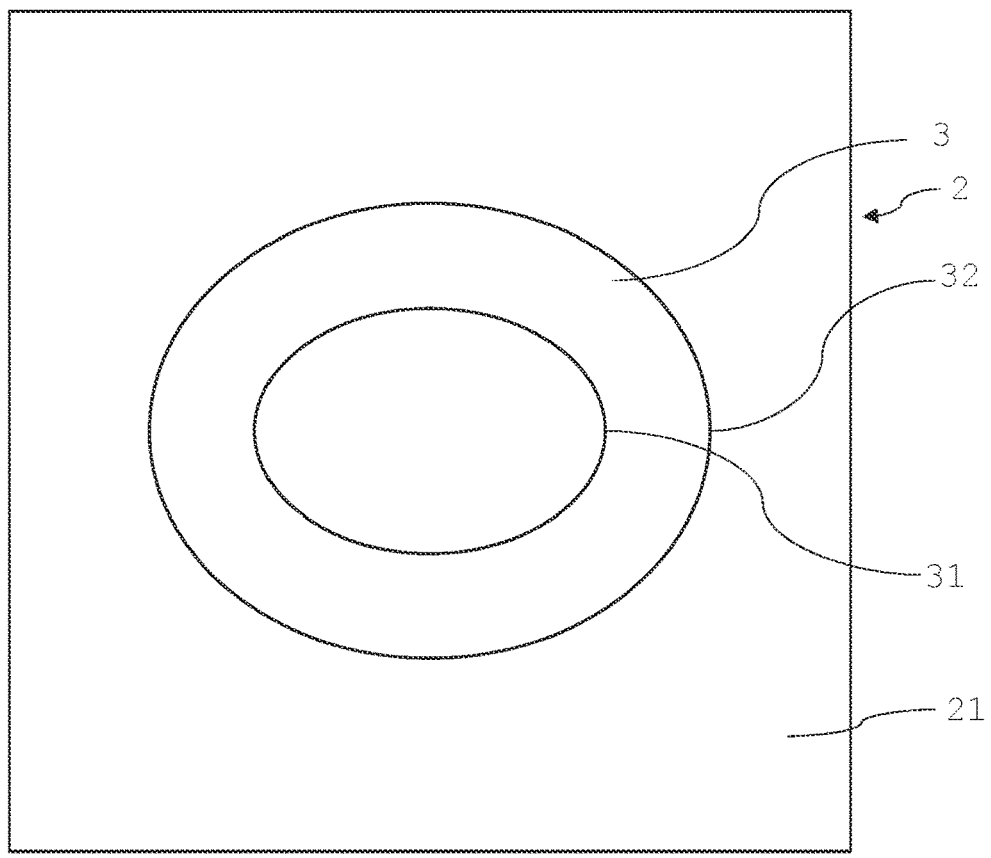
Figure 18:
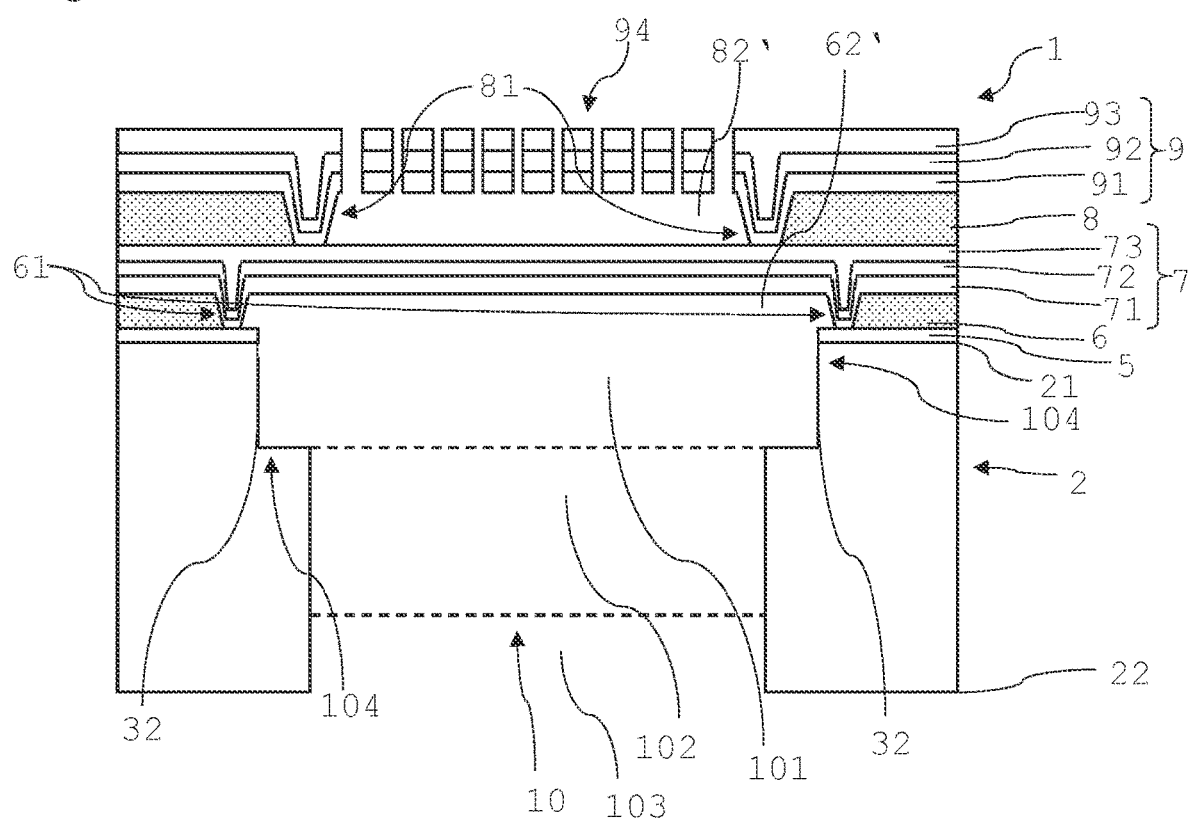

FIG. 17 shows a second step of a second embodiment of a method for forming a MEMS microphone in schematic top view; and FIG. 18 shows third embodiment of a MEMS microphone in schematic cross section.

DETAILED DESCRIPTION OF ILLUSTRATIVE EMBODIMENTS

In the following a first embodiment of a method for forming a MEMS microphone is described in reference to figures showing intermediate steps during the process in schematic views.

Figure 1:
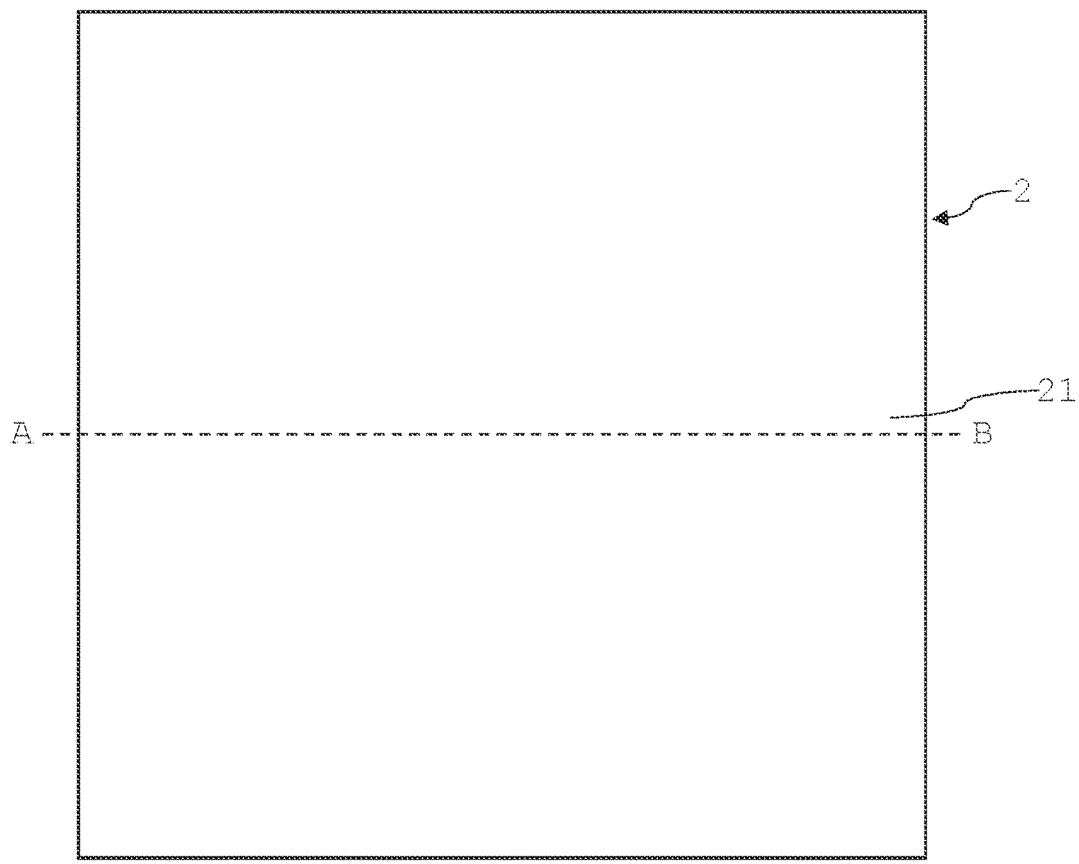

FIG. 1 shows a schematic top view on an upper substrate surface 21 of a substrate 2.

Figure 2:
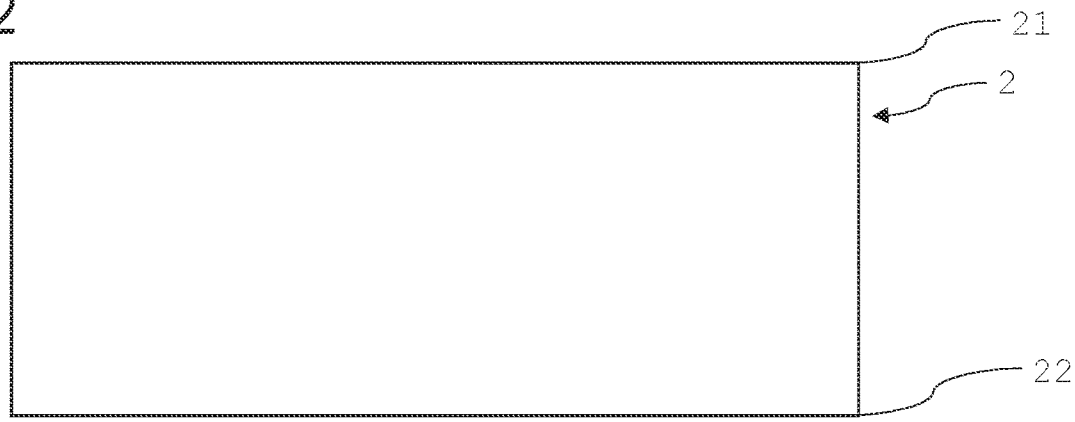

FIG. 2 shows a schematic cross-section of the substrate 2 along the line A-B indicated in FIG. 1.

A lower substrate surface 22 is the surface of the substrate 2 opposite to the upper substrate surface 21.

The material of the substrate 2 is silicon. For example, the substrate 2 is a silicon wafer.

Figure 3:
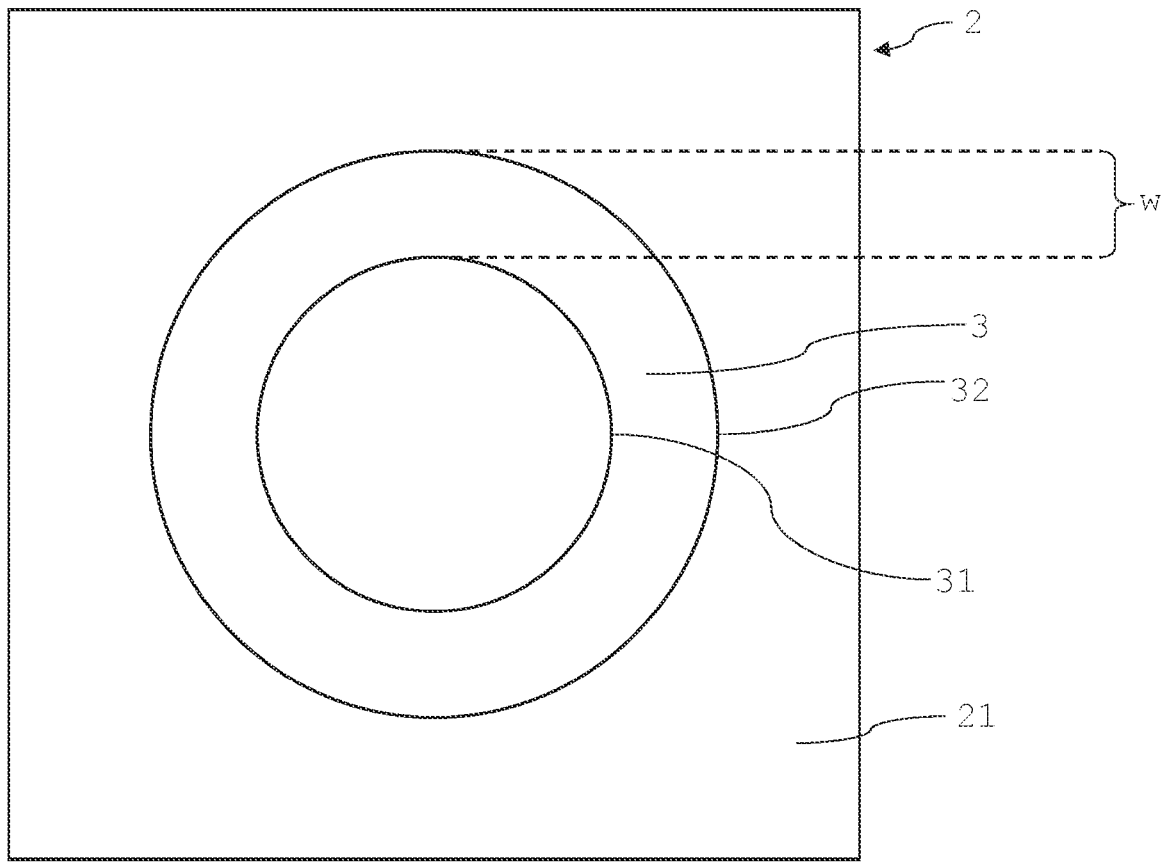

As shown in FIGS. 3 (top view) and 4 (cross section), a trench 3 is formed in the upper substrate surface by a first structuring method.

In the first embodiment, the trench 3 is ring shaped. The trench 3 has a depth d and width w between an inner rim of the trench 31 and an outer rim of the trench 32.

The width w of the trench 3 is chosen to compensate for the tolerance of an etching technique for forming a preliminary recess, as is described below.

For example, the width may be 30 µm. For example, the depth d of the trench 3 may be 2-8 µm.

Figure 4:
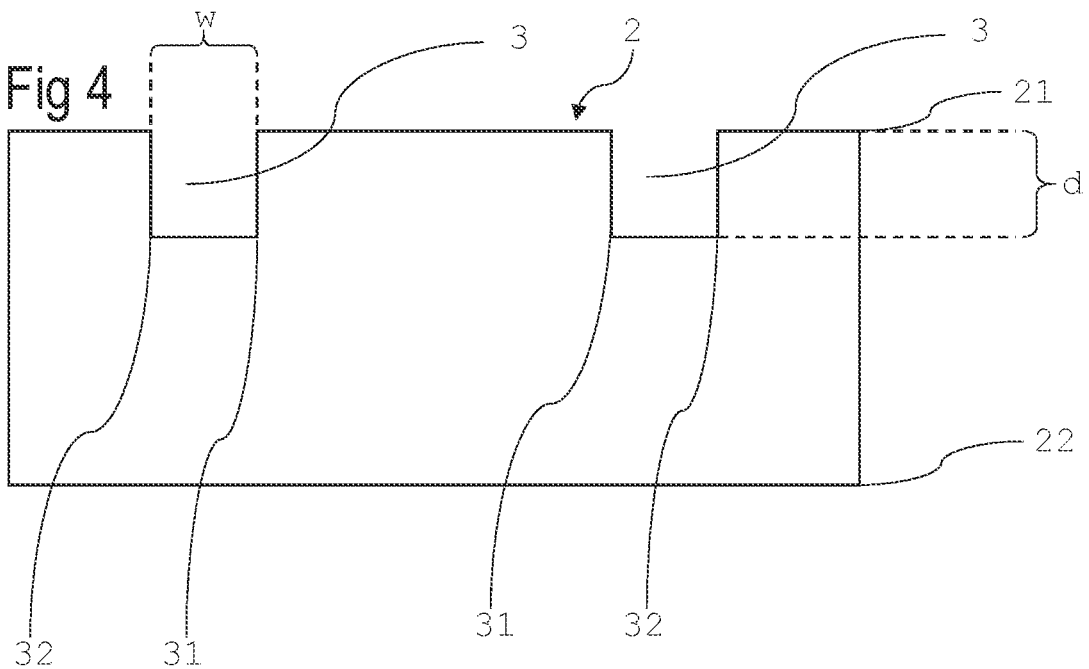

Preferably, the trench has a rectangular cross section, as indicated in FIG. 4.

The first structuring method can be any method suitable for forming a ring shaped trench 3 into a silicon substrate 2. Preferably, the first structuring method has a tolerance of ±1 µm or below.

For example, a sputtering method can be applied to form the trench.

Preferably, a slow DRIE etching technique is applied from the front side, i.e. the side of the upper substrate surface 21. The slow DRIE etching technique comprises application of a photolithographic step with a precision/tolerance of below ±1 µm. Subsequently, the trench 3 is etched into the substrate and masks from the photolithography are removed.

For example the slow DRIE method has etching rates in the order of below 1 µm/min and up to 4 µm/min.

Figure 5:
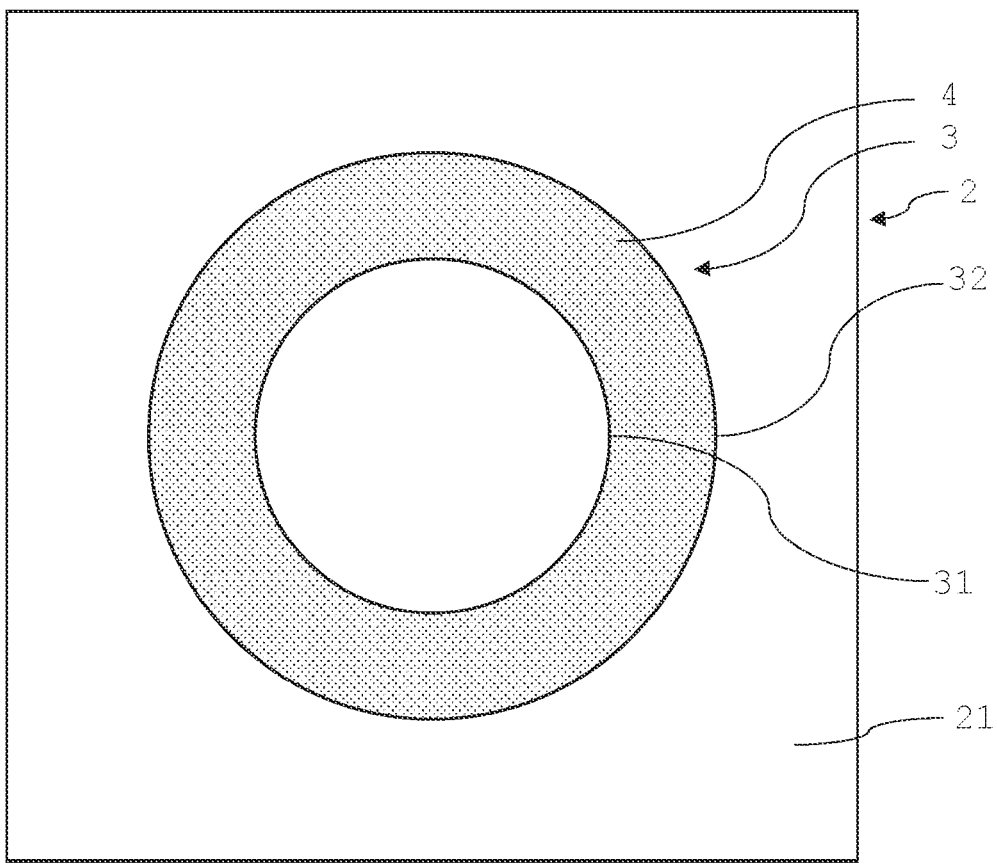
Figure 6:
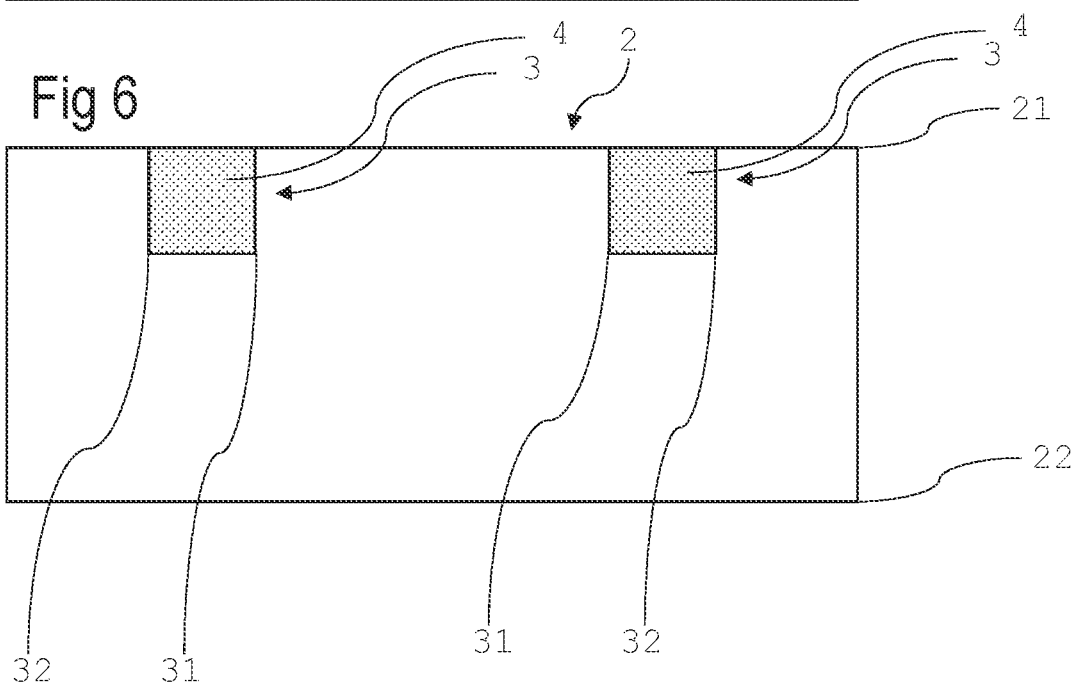

Next, the trench 3 is filled with a filling material 4, as shown in FIGS. 5 (top view) and 6 (schematic cross-section).

The filling material 4 comprises silicon oxide. The filling material 4 can be pure silicon oxide, or preferably, doped silicon oxide, such as phosphosilicate glass or borophosphosilicate glass.

The doped silicon oxide has the advantage that it can be etched more efficient in a subsequent buffered oxide etching step than pure silicon oxide.

The silicon oxide or doped silicon oxide can be deposited by any suitable means. Preferably, it is deposited by a plasma enhanced chemical vapor deposition (PECVD) method using tetraethyl orthosilicate (TEOS)

Preferably, a chemical mechanical polishing step is applied after filling of the trench 3, to level the upper surface of the filling material 4 and the upper substrate surface 21.

Figure 7:
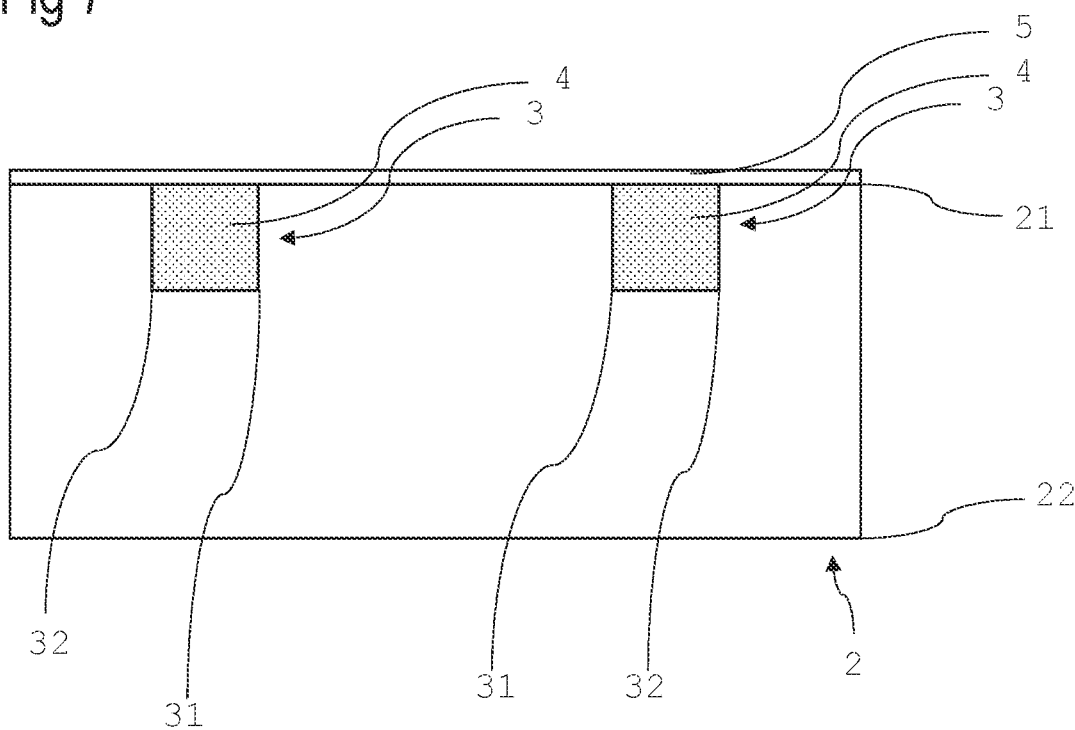

As shown in FIG. 7 in schematic cross section a silicon nitride layer 5 is formed on the upper substrate surface 21 comprising the filled trench 3.

The material of the silicon nitride layer 5 is preferably low stress silicon nitride that shows comparatively low tensile stress in the order of 250 MPa or below. Preferentially, the low stress silicon nitride has a tensile stress of 135 MPa or below.

The silicon nitride layer 5 can be deposited by any suitable means. Preferably, the silicon nitride layer 5 is deposited by low pressure chemical vapor deposition (LPCVD).

The thickness of the silicon nitride layer 5 can be in the range of 0.1 µm to 1 µm and preferably in the range of 0.1 µm to 0.3 µm.

Figure 8:
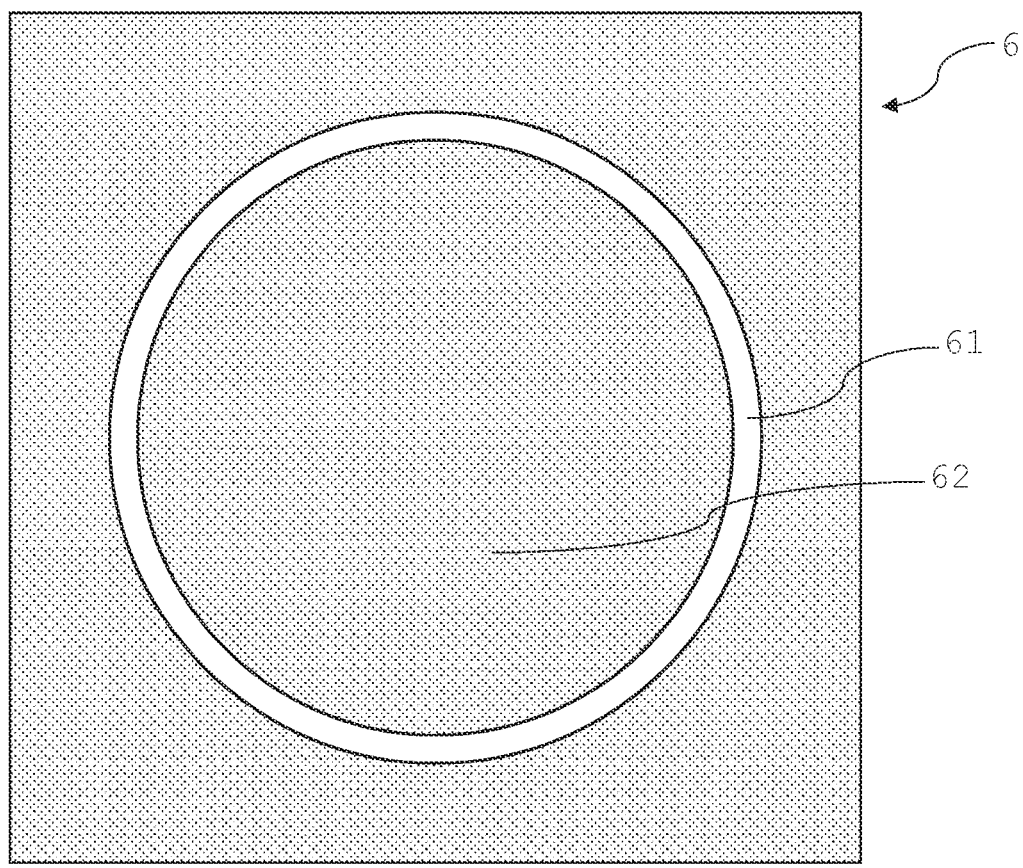
Figure 9:
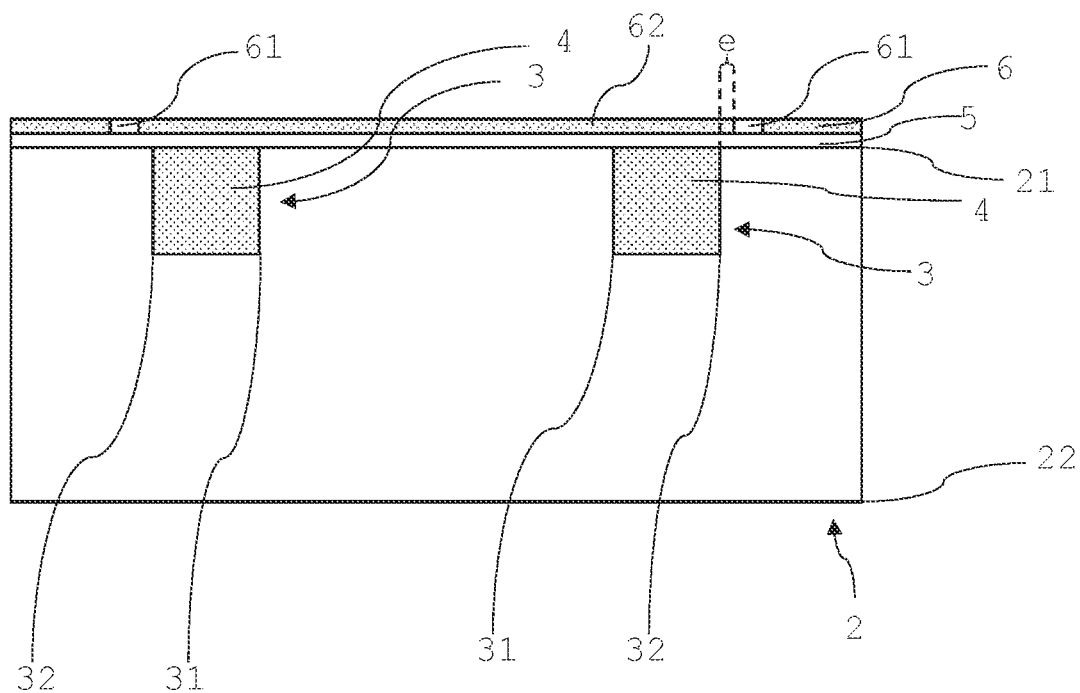

As shown in FIGS. 8 (top view) and 9 (schematic cross section) a first insulation layer 6 is arranged on the silicon nitride layer 5.

The material of the first insulation layer 6 is silicon oxide, which can be deposited by any suitable means. Preferably, it is deposited a PECVD method using TEOS.

A thickness of the first insulation layer 6 may be 0.5 µm.

A fraction of the first insulation layer 6 is removed to form a trench-shaped notch in the first insulation layer 6 at which bottom the silicon nitride layer 5 is exposed.

This trench-shaped notch is ring-shaped in the present embodiment.

The trench-shaped notch can be formed by any suitable method, for example lithography-based methods or etching techniques.

Subsequently the trench-shaped notch is filled with silicon nitride, and more preferably with low-stress silicon nitride to form the lower etch stopper 61. The silicon nitride of the lower etch stopper 61 can be deposited by any suitable means. Preferably, the silicon nitride is deposited by LPCVD.

The lower etch stopper 61 is ring-shaped and frames an inner portion 62 of the first insulation layer 6.

The ring formed by the lower etch stopper 61 is co-centered with the ring-shaped trench 3. The lower etch stopper 61 is positioned at a distance e from the outer rim 32 of the trench 3. The distance e can be 1-5 µm, for example.

Figure 10:
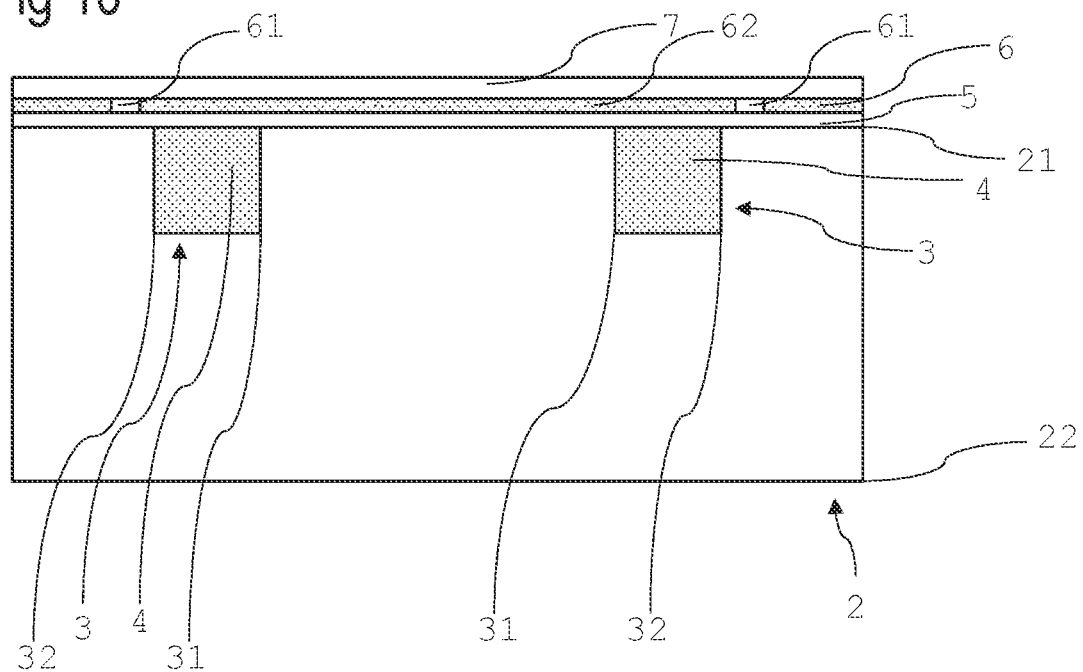

Next, as shown in FIG. 10 in schematic cross section, a membrane-layer 7 is arranged on the first insulation layer 6.

The membrane-layer 7 comprises silicon, which can be deposited for example by LPCVD. The membrane-layer 7 can, for example, comprise doped poly-silicon.

The thickness of the membrane-layer 7 can be in the order of 0.5 µm.

At this process step the membrane-layer 7 can be structured, for example by photo-lithographic methods.

Figure 11:
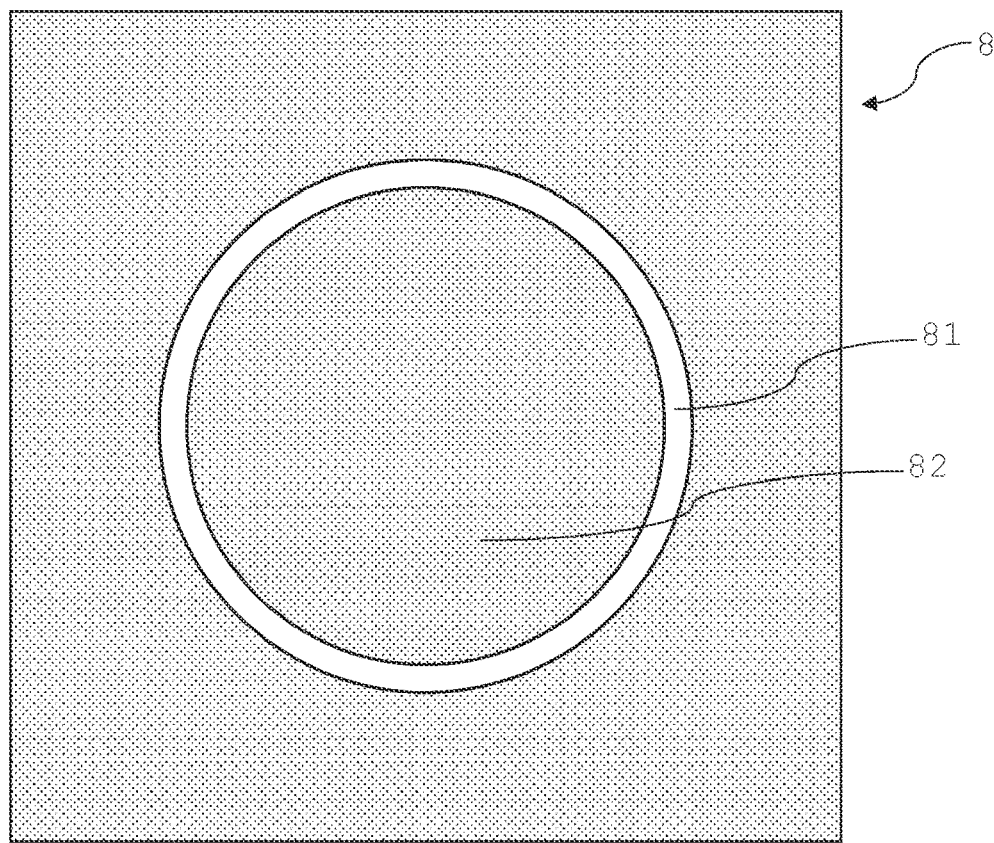
Figure 12:
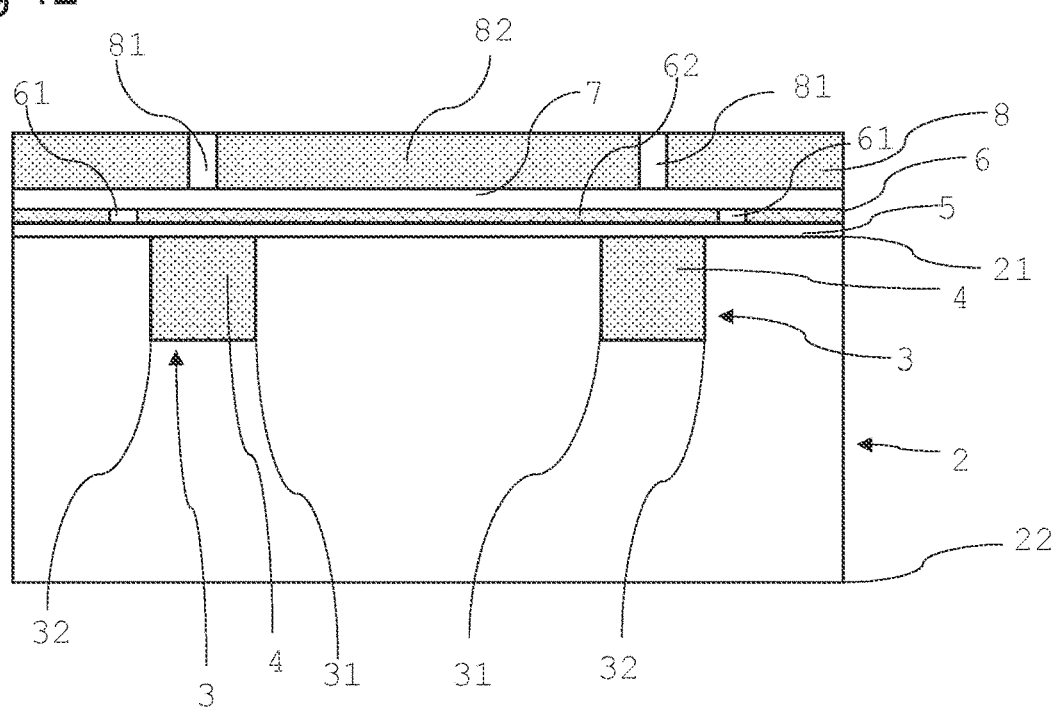

As shown in FIGS. 11 (top view) and 12 (schematic cross section) a second insulation layer 8 is arranged on the membrane-layer 7.

The material of the second insulation layer 8 is silicon oxide, which can be deposited by any suitable means. Preferably, it is deposited a PECVD method using TEOS.

The thickness of the second insulation layer 8 may be in the order of 2.35 µm.

A fraction of the second insulation layer 8 is removed to form a trench-shaped notch in the second insulation layer 8 at which bottom the membrane-layer 7 is exposed.

This trench-shaped notch is ring-shaped.

The trench-shaped notch can be formed by any suitable method, for example lithography-based methods or etching techniques.

Subsequently the trench-shaped notch is filled with silicon nitride, and preferably with low-stress silicon nitride, to form the upper etch stopper 81. The silicon nitride upper etch stopper 81 can be deposited by any suitable means. Preferably, the silicon nitride upper etch stopper 81 is deposited by LPCVD.

The upper etch stopper 61 is ring-shaped and frames an inner portion 82 of the second insulation layer 8.

The ring formed by the upper etch stopper 81 is co-centered with the ring-shaped trench 3 and with the ring formed by the lower etch stopper 61. The ring of the upper etch stopper 81 has a smaller diameter than the ring of the lower etch stopper 61.

The lateral distance between the upper etch stopper 81 and the lower etch stopper 61 is defined as lateral membrane suspension distance, and it is measured parallel to the upper substrate surface 21. The lateral membrane suspension distance equals half the diameter difference between the rings of the upper etch stopper 81 and the lower etch stopper 61.

Preferably, the lateral membrane suspension distance is in the range of 3-10 µm.

Figure 13:
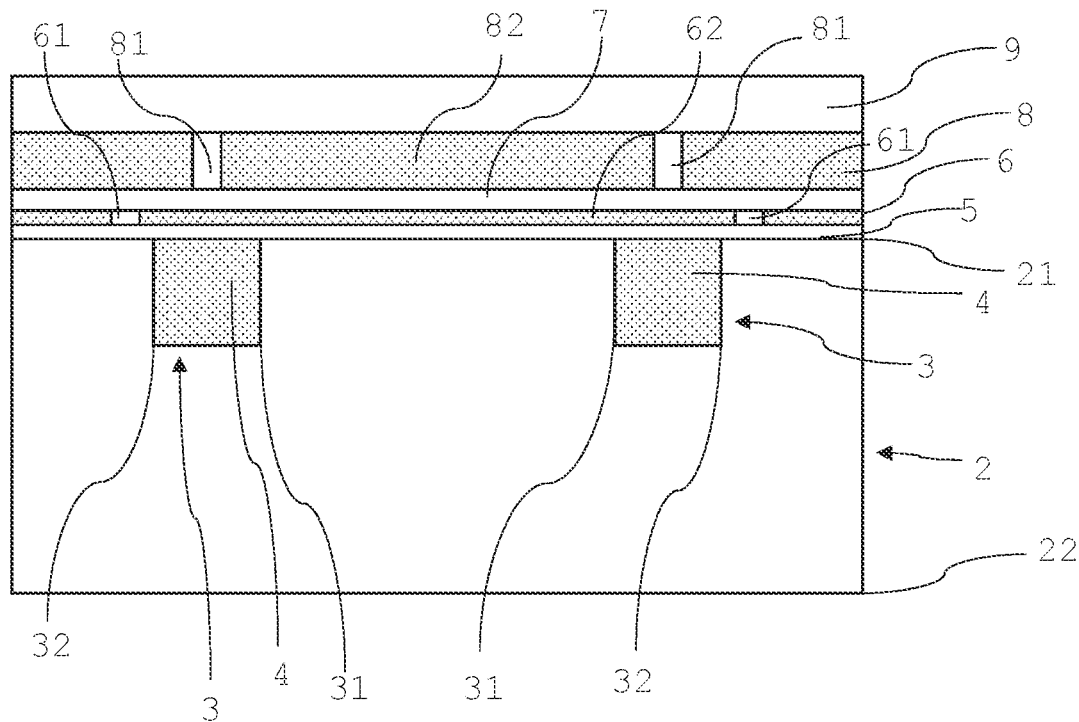

As shown in the schematic cross section in FIG. 13, next a back plate layer 9 is formed on the second insulation layer 8.

The back plate layer 9 comprises silicon, which can be deposited for example by LPCVD. The back plate layer 9 can, for example, comprise doped poly-silicon.

The thickness of the back plate layer 9 can be in the order of 1 µm to 5 µm.

Electrical contacts can be applied to the as assembled layered stack, after forming of the back plate layer 9 (not shown).

At this process step the back plate layer 9 can be structured laterally, similar as the membrane 7, for example to comprise venting holes. This can be performed, for example, by photo-lithographic methods.

Figure 14:
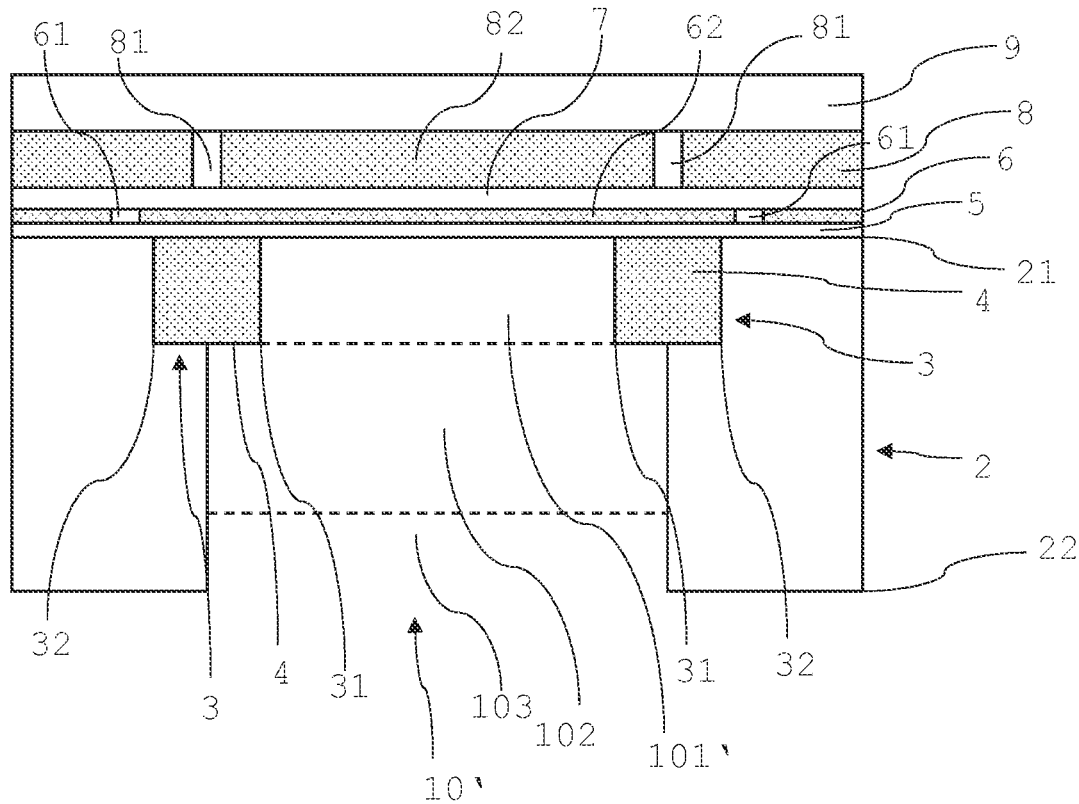

As shown in the schematic cross section in FIG. 14, next a preliminary recess 10' is formed in the substrate 2 by a second etching technique.

The second etching technique may be any suitable method for forming a preliminary recess 10' into a silicon substrate 2. Preferably, the preliminary recess 10' is formed by a fast DRIE method applied from the back side, i.e. the side of the lower substrate surface 22.

The substrate 2 is etched from the lower substrate surface 22 up to the upper substrate surface 21.

The preliminary recess 10' comprises the preliminary upper recess region 101'.

The preliminary upper recess region 101' is the portion of the preliminary recess 10' in closest proximity to the membrane-layer 7.

The preliminary upper recess region 101' extends from the upper substrate surface 21 to the depth d. It is framed by the inner rim 31 of the filling material 4 of the trench 3.

In other words, the second etching technique removes the substrate material until at least the inner rim 31 of the filling material 4 is exposed completely.

The preliminary upper recess region 101' is of cylindrical shape, with walls of the preliminary upper recess region 101' (=inner rim 31) being perpendicular to the upper substrate surface 21.

The region of the preliminary recess 10' directly below the preliminary upper recess region 101' is defined as intermediate recess region 102.

The diameter of the intermediate recess region 102 is at least the diameter of the preliminary upper recess region 101'.

Typically, the diameter of the intermediate recess region 102 is larger than the diameter of the preliminary upper recess region 101'.

At maximum, the diameter of the intermediate recess region equals the diameter of the outer rim 32 of the trench.

The region of the preliminary recess 10', which is not the preliminary upper recess region 101' or the intermediate recess region 102, is defined as lower recess region.

Preferably, the diameter of the lower recess region 103 is at least the diameter of the preliminary upper recess region 101'.

For example, the diameter of the lower recess region 103 is larger than the diameter of the preliminary upper recess region 101'.

Preferentially, at maximum, the diameter of the lower recess region equals the diameter of the outer rim 32 of the trench.

Figure 15:
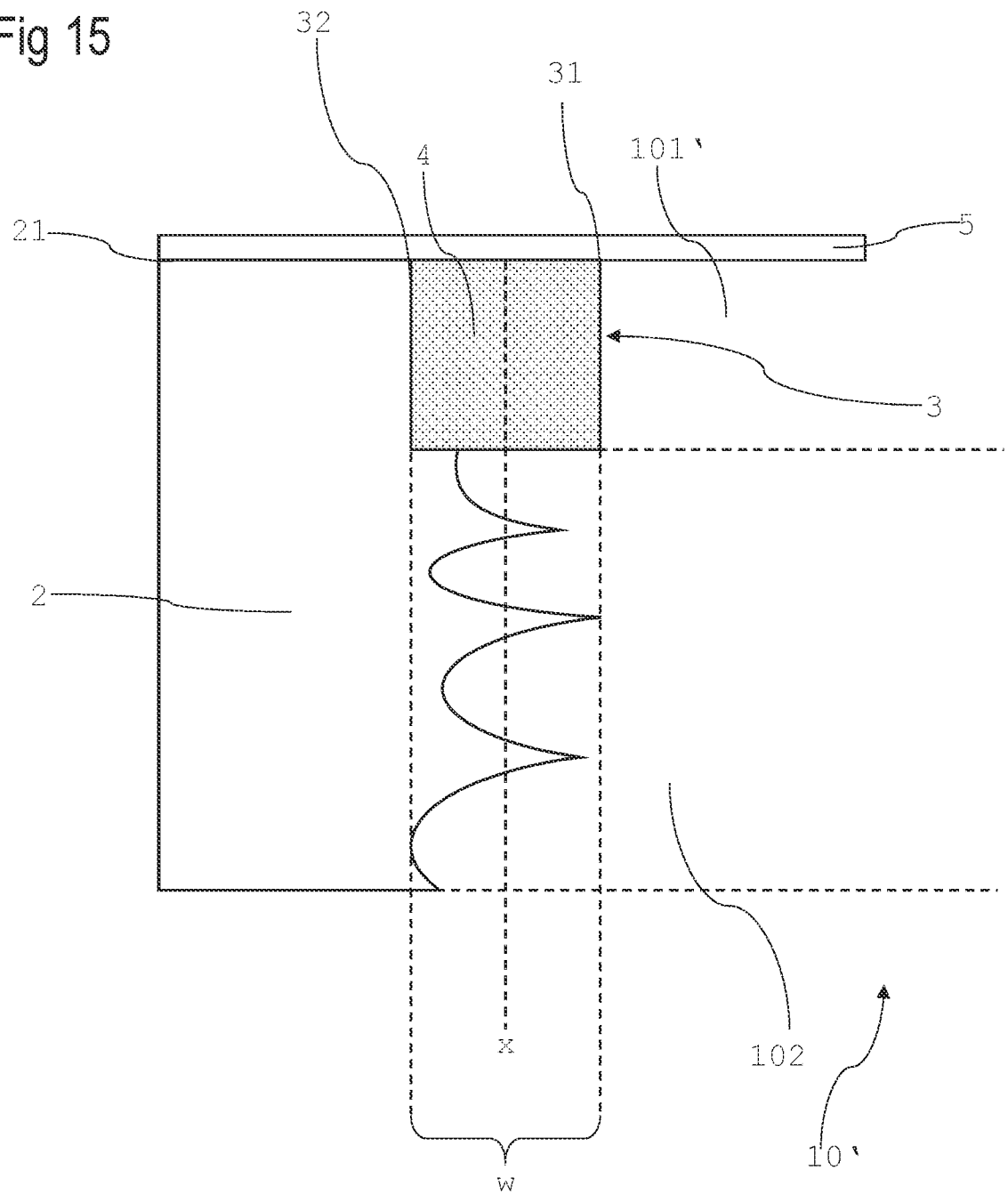

FIG. 15 shows an enlarged excerpt of the intermediate structure during formation of a MEMS microphone shown in FIG. 14, after forming of the preliminary recess 10'.

The second etching technique in general and a fast DRIE method in particular have a limited tolerance in forming the side walls of the preliminary recess 10'.

In the preliminary upper recess region 101', the side walls are defined with the tolerance of the first structuring method, as the filling material 4 has a considerably lower etching rate in the second etching technique than the silicon substrate 2.

In particular, fast DRIE causes notches and bulges in the wall of the intermediate recess region 102 around an intended position x of the wall.

However, these notches and bulges, i.e. the entire wall of the intermediate recess region 102 must not extend beyond the spatial volume perpendicularly below the filling material 4 of the trench 3. This volume has the width w of the trench and is a semi-infinite cylindrical shell extending below the filling material 4 of the trench 3.

This means, that the width w of the trench 3 is chosen dependent on the tolerance of the second etching technique. The lateral dimension of the trench 3 extends with the given tolerance of the etching step from an intended position x of the sidewall in both directions that is the width w is two times the tolerance.

For example, a fast DRIE method has a tolerance of ±15 µm. Therefore, the width w is chosen to be at least 15 µm.

Preferentially, the width w is chosen to be exactly 15 µm. Thus, the trench 3 can compensate for the tolerance of the second etching technique, but the outer rim 32 of the trench, and with it the rim of the upper recess region in the as assembled device (compare below) is as close as possible to the average diameter of the recess.

Preferentially, the lower recess region fulfills the same conditions, as the intermediate recess region.

Figure 16:
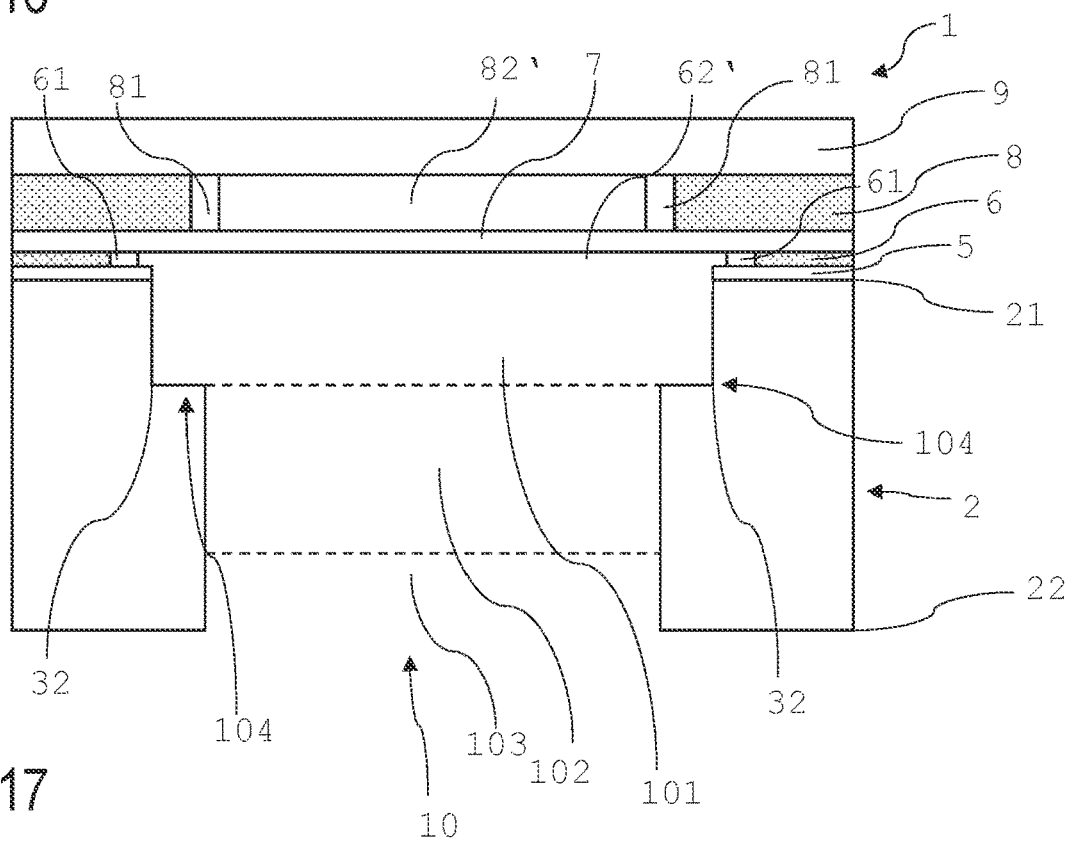

FIG. 16 shows the as assembled MEMS microphone 1.

It is formed from the intermediate structure shown in FIG. 14 by applying a third etching technique.

By the third etching technique, the inner portion 82 of the second insulation layer 8 is removed creating the opening 82' in the second insulation layer 8 between the back plate layer 9 and the membrane-layer 7. The opening 82' is framed by the upper etch stopper 81.

Further, the inner portion 62 of the first insulation layer 6 is removed by the third etching technique, creating the opening 62' in the first insulation layer 6 directly below the membrane. The opening 62' is framed by the lower etch stopper 61.

Further, the filling material 4 is removed by the third etching technique. Thereby, the upper recess region 101 forms as a combined volume of the preliminary upper recess region and the volume of the trench 3.

Thus, the recess 10 is formed from the upper recess region 101, the intermediate recess region 102, and the lower recess region 103.

At maximum, the diameter of the intermediate recess region 102, is as large as the diameter of the upper recess region 101, i.e. the diameter of the outer rim 32 of the trench 3.

Preferably, the diameter of the intermediate recess region 102, is smaller than the diameter of the upper recess region 101, i.e. the diameter of the outer rim 32 of the trench 3.

Thereby, the step 104 between the upper recess region 101 and the intermediate recess region 102 is formed in the substrate 2.

During application of the third etching technique an opening is also etched into the silicon nitride layer 5. The opening in the silicon nitride layer 5 has approximately the diameter of the upper recess region 101 and connects the recess 10 to the opening 62' in the first insulation layer 6, thereby forming a sound channel towards the membrane-layer.

The mean diameter of the sound channel can be in the range of 500-1700 µm.

The overall dimensions of the MEMS microphone can be for example, 0.8 mm×2 mm×2 mm.

The third etching technique, can be any suitable technique to etch silicon oxide or doped silicon oxide efficiently, while silicon and silicon nitride are less affected by the etching.

In other words, the etching rates of silicon oxide or doped silicon oxide in the third etching technique are greater than those of silicon and silicon nitride.

For example, the third etching step may be a buffered oxide etching step based on hydrogen-fluoride etching.

The third etching technique can comprise either one common etching step or two sub-steps.

In the case of one common etching step, the buffered oxide etching solution can be applied via the recess 10. Thereby, the etching solution first dissolves the filling material 4, and slowly etches through the thin nitride layer 5. Then the solution again etches fast through the silicon oxide of the inner portion 62 of the first insulation layer 6. The lower etch stopper prevents over etching of the first insulation layer 6.

Through pores in the membrane-layer 7, the etching solution can reach the inner portion 82 of the second insulation layer and dissolve it.

If the third etching technique comprises two sub-steps, first the etching solution is applied through the recess to dissolve the filling material 4. The silicon nitride layer 5 stops the etching. The inner portions 82 and 62 of the second and the first insulation layer 8 and 6 are etched in an independent sub-step from the front side, i.e. through pores in the back plate layer 9 and in the membrane-layer 7.

The opening in the silicon nitride layer 5 is formed by the combined etching of both sub-steps.

In the as assembled MEMS device, the area of the membrane-layer 7 being freestanding over the sound channel is the active membrane area.

The lower and the upper etch stoppers 62 and 82 act as the lower and the upper membrane suspension, respectively. As they are of low-stress silicon nitride, they feature high tensile strength. Therefore, the membrane suspension can resists high deflections.

FIG. 17 shows a schematic top view of a second embodiment of a fabrication method of a MEMS microphone.

FIG. 17 shows the formation of a trench 3 in a substrate 2.

In the second embodiment, the sound channel in general, and therefore the trench 3 and the recess 10 (not shown) and all other openings (not shown) have oval shape instead of circular shape.

Otherwise, both concerning method and final device, the second embodiment is equivalent to the first embodiment, as described above.

FIG. 18 shows a schematic cross section of a third embodiment of MEMS microphone.

The third embodiment resembles the first or the second embodiment, except for the following properties.

The membrane-layer 7 and the back plate layer 9 are both multi-layered.

The membrane-layer 7 comprises a lower membrane-layer 71, a central membrane-layer 72 and an upper membrane-layer 73, directly arranged one upon another. This means, the central membrane-layer 72 is sandwiched by the upper and the lower membrane-layers 71 and 73.

The upper and the lower membrane-layers 71 and 73 are low-stress silicon nitride layers, and the central membrane-layer 72 is a doped poly-silicon layer. Both can be deposited by LPCVD methods The doped poly-silicon provides conductivity to the membrane 7. The low stress silicon nitride enhances the resistivity and also insulates the central membrane-layer 72.

Furthermore, the lower etch stopper 61 is formed as a part of the membrane-layer 7.

To this end, a V-shaped notch is formed in the first insulation layer 6 and the membrane-layers 71, 72, 73 are deposited onto the as formed structure without individually forming an etch stopper. By this, the V-shape is transferred into the membrane-layer 7, forming the lower etch stopper 61.

Equivalently, also the back plate layer 9 is multi-layered. The back plate layer 9 comprises a lower back plate layer 91, a central back plate layer 92 and an upper back plate layer 93, directly arranged one upon another. This means, the central back plate layer 92 is sandwiched by the upper and the lower back plate layers 91 and 93.

The lower and the upper back plate layers 91 and 93 are low-stress silicon nitride layers, and the central back plate layer 92 is a doped poly-silicon layer. Both can be deposited by LPCVD methods.

The doped poly-silicon provides conductivity to the membrane. The low stress silicon-nitride insulates the central back plate layer 92.

Furthermore, the upper etch stopper 81 is formed as a part of the back plate layer 9.

To this end, a V-shaped notch is formed in the second insulation layer 8 and the back plate layers 91, 92, 93 are deposited onto the as formed structure without individually forming an etch stopper. By this, the V-shape is transferred into the back plat layer 9, whereby the upper etch stopper 81 is formed.

By forming the etch stoppers 61 and 81 from the membrane-layer and the back plate layer, additional formation steps can be avoided, making the production process more efficient.

Furthermore, FIG. 18 explicitly shows a structured inner region 94 of the back plate 9.

Although the invention has been illustrated and described in detail by means of the preferred embodiment examples, the present invention is not restricted by the disclosed examples and other variations may be derived by the skilled person without exceeding the scope of protection of the invention.

What is claimed is:
1. A device comprising:
a substrate comprising an upper substrate surface and a lower substrate surface, wherein the lower substrate surface is a surface of the substrate opposite to the upper substrate surface;
a membrane-layer suspended above the upper substrate surface,
wherein the substrate comprises a recess penetrating the substrate between the lower substrate surface and the upper substrate surface,
wherein the membrane-layer spans the recess,
wherein the recess comprises:
an upper recess region,
an intermediate recess region, and
a lower recess region,
wherein the upper recess region is a part of the recess in direct vicinity to the upper substrate surface, the intermediate recess region is a part of the recess directly below the upper recess region, and the lower recess region is a part of the recess other than the upper recess region and the intermediate recess region, and
wherein a cross-sectional area of the upper recess region determined parallel to the upper substrate surface is larger than a respective cross-sectional area of the intermediate recess region; and a first insulation layer arranged between the upper substrate surface and the membrane-layer, wherein the first insulation layer comprises an opening framed by a lower etch stopper and the lower etch stopper is positioned at a distance outward from an edge of the upper recess region, and wherein the lower etch stopper has a higher tensile strength than a main component of the first insulation layer.

2. The device according to claim 1, further comprising a silicon nitride layer arranged directly on the upper substrate surface, and wherein an opening in the silicon nitride layer is at least as wide as the opening of the recess in the upper substrate surface and at maximum as wide as the opening in the first insulation layer.

3. The device according to claim 1, further comprising a second insulation layer arranged directly above the membrane-layer, wherein an opening in the second insulation layer is framed by an upper etch stopper, and wherein the upper etch stopper has a higher tensile strength than a main component of the second insulation layer.

4. The device according to claim 3, wherein a material of the substrate is silicon, wherein a material of the second insulation layer and the first insulation layer comprises silicon oxide, and wherein a material of the lower etch stopper and of the upper etch stopper comprises at least one substance selected from silicon or silicon nitride.

5. The device according to claim 1, wherein the device is a MEMS microphone.

6. A method for forming a device, the method comprising:
providing a substrate comprising an upper substrate surface and a lower substrate surface that are opposing each other;
forming a continuous, self-contained trench with a width and a depth in the upper substrate surface by a first structuring technique;
filling the trench with a filling material;
forming a membrane-layer above the upper substrate surface comprising the filled trench;
forming a preliminary recess in the substrate by a second etching technique applied from a side of the lower substrate surface, wherein the preliminary recess comprises a preliminary upper recess region extending from the upper substrate surface to the depth, and the preliminary upper recess region is framed by the filling material of the trench, wherein an intermediate recess region is a region of the preliminary recess directly below the preliminary upper recess region, wherein sidewalls of the intermediate recess region lie within a spatial volume perpendicularly below the trench, wherein a lower recess region is a part of the preliminary recess other than the preliminary upper recess region and the intermediate recess region,
forming a recess by removing the filling material with a third etching technique; and
wherein the recess comprises the intermediate recess region, the lower recess region, and an upper recess region, and wherein the upper recess region is formed by a combined volume of the trench and the preliminary upper recess region.

7. The method according to claim 6, wherein the width of the trench is at least twice a tolerance of the second etching technique in forming the intermediate recess region.

8. The method according to claim 6, wherein the filling material comprises a lower etching rate than the substrate in the second etching technique.

9. The method according to claim 6, wherein the first structuring technique applied to the upper substrate surface has a lower tolerance than the second etching technique applied to the substrate.

10. The method according to claim 6, wherein a tolerance of the first structuring technique applied to the upper substrate surface is at least 10 times smaller than a tolerance of the second etching technique applied to the substrate.

11. The method according to claim 6, wherein a tolerance of the first structuring technique applied to the upper substrate surface is $\pm 1$ µm or less, and wherein a tolerance of the second etching technique applied to the substrate is $\pm 1$ µm or less.

12. The method according to claim 6,
wherein a material of the substrate is silicon,
wherein the filling material is at least one selected from the group consisting of silicon oxide, phosphosilicate glass, and borophosphosilicate glass,
wherein the first structuring technique is a slow deep reactive ion etching technique applied from the side of the upper substrate surface,
wherein the second etching technique is a fast deep reactive ion etching technique applied from the side of the lower substrate surface, and
wherein the third etching technique is a buffered oxide etching technique.

13. The method according to claim 6, further comprising applying chemical mechanical polishing to the upper substrate surface and the filled trench, directly after filling the trench with the filling material.

14. The method according to claim 6, wherein the filling material comprises a higher etching rate than the substrate in the third etching technique.

15. The method according to claim 14, further comprising:
forming a first insulation layer between the upper substrate surface and the membrane-layer; and
forming a lower etch stopper in the first insulation layer, wherein the lower etch stopper is positioned at a distance e away from an outward rim of the trench, and
wherein a material of the lower etch stopper has a lower etching rate in the third etching technique than at least an inner portion of the first insulation layer, which is framed by the lower etch stopper.

16. The method according to claim 15, further comprising:
forming a silicon nitride layer directly on the upper substrate surface, before forming the first insulation layer; and
removing the silicon nitride layer in a section arranged perpendicularly above the upper recess region.

17. The method according to claim 15, further comprising:
forming a second insulation layer above the membrane-layer; and
forming an upper etch stopper in the second insulation layer,
wherein a material of the upper etch stopper has a lower etching rate in the third etching technique than at least an inner portion of the second insulation layer, which is framed by the upper etch stopper.

18. The method according to claim 17, wherein an inner portion of the first insulation layer framed by the lower etch stopper and the inner portion of the second insulation layer framed by the upper etch stopper are removed during the third etching technique.

19. The method according to claim 17,
wherein the material of the second insulation layer and the first insulation layer comprises silicon oxide, and
wherein the material of the lower etch stopper and the upper etch stopper comprises at least one substance selected from silicon and silicon nitride.

20. The method according to claim 6, wherein the device is a MEMS microphone.

* * * * *